United States Patent
Appelt et al.

[19]

[11] Patent Number: 6,096,665
[45] Date of Patent: *Aug. 1, 2000

[54] TECHNIQUE FOR FORMING RESIN-IMPREGNATED FIBERGLASS SHEETS WITH IMPROVED RESISTANCE TO PINHOLING

[75] Inventors: Bernd Karl Appelt, Apalachin; Robert Maynard Japp, Vestal; Kostantinos Papathomas, Endicott; William John Rudik, Vestal, all of N.Y.

[73] Assignee: International Business Machines Corporation, Armonk, N.Y.

[*] Notice: This patent is subject to a terminal disclaimer.

[21] Appl. No.: 08/891,423

[22] Filed: Jul. 9, 1997

Related U.S. Application Data

[62] Division of application No. 08/716,815, Sep. 10, 1996, Pat. No. 5,719,090.

[51] Int. Cl.⁷ .............................. B05D 1/38; B32B 31/08
[52] U.S. Cl. .................................. 442/62; 442/64; 442/66; 442/71; 428/356; 428/901
[58] Field of Search .................................. 442/62, 64, 66, 442/71; 428/356, 901

[56] References Cited

U.S. PATENT DOCUMENTS

| | | |
|---|---|---|
| 3,698,940 | 10/1972 | Mersereau et al. . |
| 4,024,305 | 5/1977 | Alpaugh et al. . |
| 4,456,712 | 6/1984 | Christie et al. . |
| 4,675,235 | 6/1987 | Wu . |
| 4,690,836 | 9/1987 | Clarke et al. . |
| 4,772,493 | 9/1988 | Syrop et al. . |
| 4,804,427 | 2/1989 | Paul et al. . |
| 4,954,200 | 9/1990 | Trewiler . |
| 5,104,474 | 4/1992 | Scola et al. . |
| 5,104,698 | 4/1992 | Hayashi et al. . |
| 5,137,756 | 8/1992 | Harada . |
| 5,266,139 | 11/1993 | Yokota et al. . |
| 5,273,816 | 12/1993 | Olson et al. . |
| 5,470,647 | 11/1995 | Zimics et al. . |
| 5,492,722 | 2/1996 | Tait et al. . |
| 5,541,000 | 7/1996 | Hardy et al. . |
| 5,554,667 | 9/1996 | Smith et al. . |

FOREIGN PATENT DOCUMENTS

| | | |
|---|---|---|
| 61-248529 | 11/1986 | Japan . |
| 4-153230 | 5/1992 | Japan . |
| 5-078945 | 3/1993 | Japan . |

*Primary Examiner*—Richard Weisberger
*Attorney, Agent, or Firm*—William N. Hogg

[57] ABSTRACT

A method for coating cloth especially fiberglass sheets with a resin and resulting structure is provided. The coating is performed in two steps. In the first step, essentially all of the strands of the fiberglass are coated with the resin solvent mixture as well as most of the interstices or openings, although some of the interstices or openings have holes where the coating does not completely fill in. This first coating is then partially cured to the extent that it will not redissolve in a second coating of the same resin solution. The coated fiberglass with partially cured resin thereon is then given a second coating of the same resin mixture which coats the first coating and fills in any holes in the first coating. This second coating is then partially cured, which advances the cure of the first coating and results in an impregnated fiberglass cloth structure for use as sticker sheets. This substantially reduces pinholing.

4 Claims, 2 Drawing Sheets

TECHNIQUE FOR FORMING RESIN-IMPREGNATED FIBERGLASS SHEETS WITH IMPROVED RESISTANCE TO PINHOLING

RELATED APPLICATIONS

This is a divisional of copending application Ser. No. 08/716,815, filed on Sep. 10, 1996.

Application Ser. No. 08/776,813, filed Sep. 10, 1996, for "Technique for Forming Resin-Impregnated Fiberglass Sheets".

Application Ser. No. 08/716,814, filed Sep. 10, 1996, for "Technique for Forming Resin-Impregnated Fiberglass Sheets Using Multiple Resins".

FIELD OF THE INVENTION

This invention relates generally to forming of resin-impregnated cloth, and more particularly to forming improved resin-impregnated fiberglass sheets and the resultant sheets which are specially adapted for use in forming chip carriers and the like, and which have improved resistance against pinholing.

BACKGROUND OF THE INVENTION

Resin-impregnated fiberglass sheets are commonly used in the formation of printed circuit boards. The fiberglass cloth is typically impregnated with the selected thermoset resin which is then partially cured and the impregnated cloth sheared to form what are known as sticker or prepreg sheets. In order to enhance the adhesion of the resin to the fiberglass, often a coupling agent, such as a silane, is coated onto the surface of the fiberglass prior to impregnation. The prepreg sheets are then laid up with sheets of metal such as copper or copper-invar-copper (CIC) and laminated with heat and pressure to fully cure the laid-up laminate with the metal sheets defining ground, power and signal planes. One of the desirable characteristics of the resin-impregnated fiberglass sheets is that the resin-impregnation must cover the fibers of the fiberglass and must be able to be partially cured to a non-tacky state wherein the sheets can be handled for the lamination process. This is often referred to as a B-stage, a cure state which allows the sheets to be sufficiently self-supporting to be laid up as a laminate, but not advanced enough in the state of cure that they are rigid or non-flowable when heated, and they can be further cured to a final cure with heat and pressure to form a laminate structure as is well known in the art. As indicated above, this lamination process normally includes the lamination of one or more sheets of metal, such as copper, CIC or other metal, to provide necessary ground planes, power planes and signal planes buried within the laminated circuit board. Also in conventional practice, openings are formed, either by drilling or other means, through the fully cured laminates which form the openings for vias or plated through holes where the connections can be made from one surface of the circuit board to the other and to the various internal planes within the laminate as required.

A conventional technique of forming the resin-impregnated fiberglass sheets is to provide a coil of the fiberglass material and unwind the fiberglass material from the coil and continuously pass it through a tank containing the solution of the desired resin in a solvent, and then pass the coated or impregnated material through a treater tower wherein heat is applied to drive off the solvent and to partially cure the resin material by initiating cross-linking and then coiling the partially-cured or B staged material into a coil. Thereafter, the partially-cured material is uncoiled and cut into sheets of the desired length. These sheets, known as prepreg sheets, are then used in the lamination process described above.

This prepreg material has long been used for manufacturing circuit boards, however, more recently, the same prepreg material and same laminating techniques that have been used to form a circuit board have been used to form chip carriers. A chip carrier is basically a small-size version of a circuit board where the metallurgy and the lay out can be much finer than on a circuit board. Printed circuit board reliability tests are defined, e.g., in IPC specifications, whereas chip carrier tests are defined by JEDEC specifications which are derived for ceramic carriers and are more severe tests. In addition, because of the finer geometry of the metallurgy and the lay-out, chip carriers are more prone to failure from various failure mechanisms.

A particular defect that can occur is the formation of pin holes. A pin hole is an opening in the resin which impregnates the fiberglass. Most pin holes will fill in during lamination. However, a small number of pin holes may remain and become the source of defects. With pin holes, shorts can develop between adjacent power planes or power and ground planes, or whatever planes happen to be adjacent to each other. Potentially, these pin holes provide shorting paths that can be established and revealed under leakage tests and other high potential tests.

The cloth styles of intermediate thickness seem to be the most susceptible to pinholing, while very light weight and heavy weight cloths have a lower defect density. Thus, according to conventional prior art techniques, in order to reduce pin hole density in any given cloth, thinner, finer weave clothes are used. However, this has several drawbacks. First, thinner, finer weave clothes are more expensive than thicker, coarser weave clothes per unit area, and secondly, the thinner clothes in many instances may not provide the necessary thickness or dielectric separation between two adjacent planes, thus necessitating the use of two laminated superimposed clothes. The use of two clothes significantly reduces the possibility of pin hole defects establishing shorting paths since it is highly unlikely that two pin holes would be exactly aligned or closely enough aligned to provide such a path. Thus, if only one cloth of the pair has a pin hole, the strong probability is that this in itself will not be enough to cause the shortage since it is highly improbable that a pin hole in the other cloth will be aligned with the pin hole in the first cloth. When thicker clothes are used with a higher pin hole density, two clothes can also be used, but this significantly increases the thickness of the circuit board or chip carrier being formed which often is undesirable. Alternatively, to maintain the thickness, two sheets of thinner cloths have to be used to attain the required reliability.

Hence, it is an object of the present invention to provide a resin-impregnated cloth and a method of forming said cloth wherein the pin hole density is significantly reduced over cloths produced by prior art techniques.

SUMMARY OF THE INVENTION

According to the present invention, a method for coating cloth especially fiberglass sheets with a resin and resulting structure is provided. The coating is performed in two steps. In the first step, essentially all of the strands of the fiberglass are coated with the resin solvent mixture as well as most of the interstices or openings, although some of the interstices or openings have holes where the coating does not completely fill in. This first coating is then partially cured to the extent that it will not redissolve in a second coating of the same resin solution. The coated fiberglass with partially cured resin thereon is then given a second coating of the same resin mixture which coats the first coating and fills in any holes in the first coating. This second coating is then partially cured, which advances the cure of the first coating and results in an impregnated fiberglass cloth structure for use as sticker sheets. This substantially reduces pinholing.

DESCRIPTION OF THE PREFERRED EMBODIMENT(S)

Figure 1:
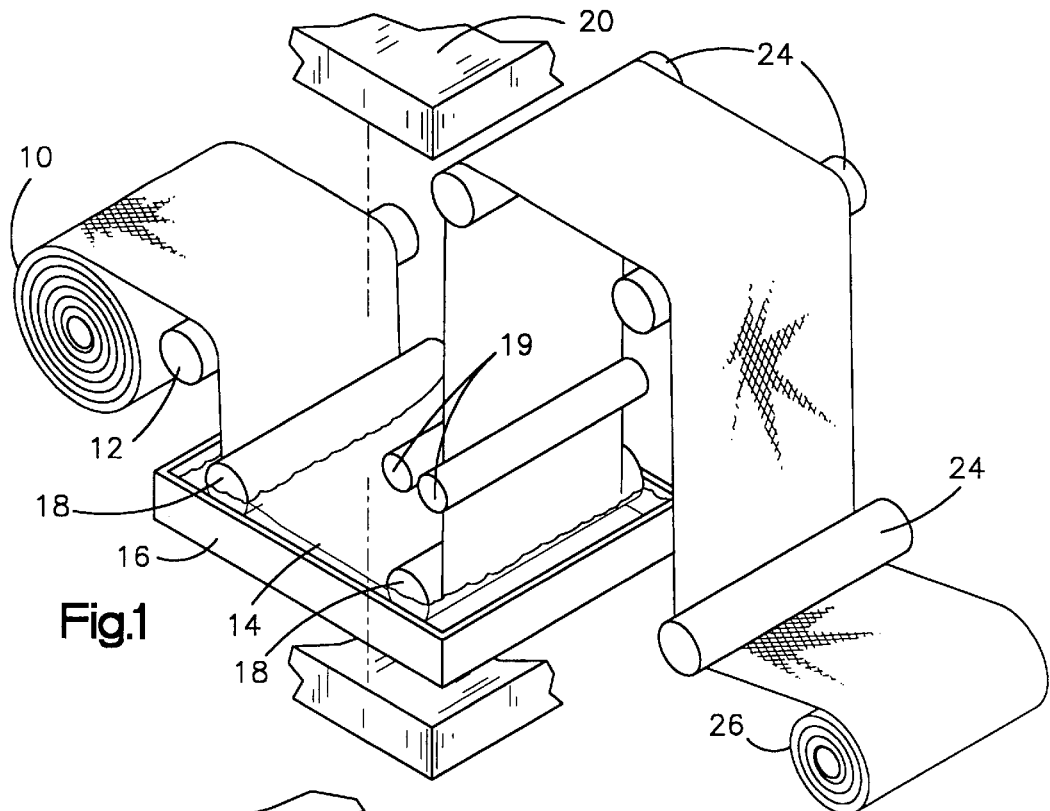
FIG. 1 is a somewhat schematic representation of an apparatus for impregnating fiberglass cloth with resin and partially curing the impregnated fiberglass.

Referring now to the drawings, and for the present to FIG. 1, a somewhat schematic representation of coating of the fiberglass cloth with resin/solvent solution and partially curing the resin is shown. A roll of fiberglass cloth 10 is shown which passes over a guide roll 12 into a solution 14 of the desired resin maintained in a selected solvent. (It is to be understood that the term "solution" is used here to describe the resin in a solvent, whether or not it be a true solution.) The solution 14 is maintained in a tank 16, and the fiberglass cloth from the roll 10 is maintained submerged in the tank by a pair of sink rolls 18. The fiberglass from the roll of fiberglass cloth 10 is passed through the solution 14 into a treater tower 20. The solution impregnates the fiberglass cloth 10 with the resin/solvent solution. The amount of resin on the cloth is usually controlled by metering rolls 19.

The treater tower 20 has a series of rolls 24 over which the fiberglass cloth 10 is reeved, and the treater tower 20 is heated, either by convection or by radiation, such as infrared radiation or by microwave, or by some other mechanism to drive the solvent from the solution and to partially cure the resin by initiating the cross-linking. The tower 20 is divided into several zones in which the temperature and the gas flow can be controlled independently. The exiting material, known as prepreg, now is comprised of glass cloth and partially reacted resin and is largely free of solvent. This state of the material is known as a B-stage, and the amount of curing required for the B-stage is well known in the art. Specifically, this B-staged resin is sufficiently cured to form a sheet of material which has the resin in such a form that it will remain in the fiberglass material and is sufficiently uncured that it can bond to other similar sheets of material and to metal sheets and be further cured to a hardened state upon application of heat and pressure. The amount of resin applied to the sheet is a function of the nature of the fiberglass cloth 10, as well as the speed of the travel of the fiberglass cloth 10, setting of the metering rolls 19, the composition of the solution of resin and solvent 14, and various physical parameters such as the temperature, viscosity and other well known factors of the solution. Likewise, the amount of cure is a function of the temperature of the tower, the amount of solution and resin applied to the fiberglass cloth, the composition of the solution and the composition of the resin, all of which also are well known in the art. The fiberglass cloth 10 as it emerges from the treater tower 20 in the B-stage state is wound into a coil of partially-cured material 26.

Figure 2A:
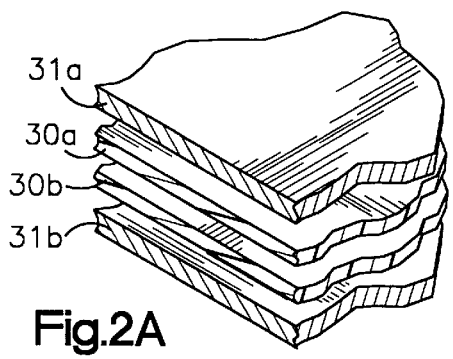
FIG. 2A is a very schematic representation of sheets of partially-cured impregnated resin and copper sheets positioned to form a laminate core structure.
Figure 2B:
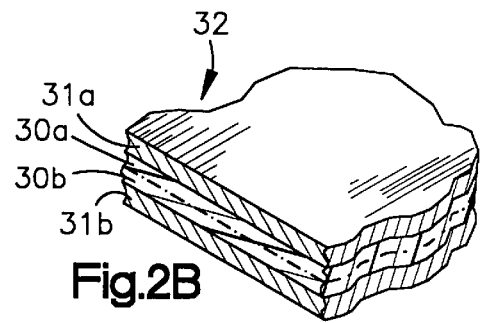
FIG. 2B is a schematic representation view of a portion of a raw core formed from sticker sheets and copper sheets.

In order to form a chip carrier or a circuit board, alternate layers of B-stage cured prepreg sheets and sheets of conductive material such as copper or copper-invar-copper (CIC) as shown in FIG. 2A are laminated together. In one typical lamination process, one or more, and conventionally two, sheets of prepreg 30a, 30b are laminated between two sheets of copper or CIC 31a, 31b using heat and pressure to form a raw core 32 (FIG. 2B). (Because of the heat and pressure, the two sheets of prepreg 30a, 30b bond together to form an essentially continuous or single layer, and bond to the two sheets of CIC 31a and 31b. The sheets of prepreg 30a, 30b are essentially fully cured as shown in FIG. 2B with a dotted line indicating their interface.

This raw core can, in the simplest embodiment, be circuitized to form a chip carrier or circuit board. Using photolithographic and drilling techniques, the sheets 31a and 31b are circuitized to form the desired circuitry on both sides of the prepreg sheets 30a and 30b and plated through holes formed where needed.

Figure 2C:
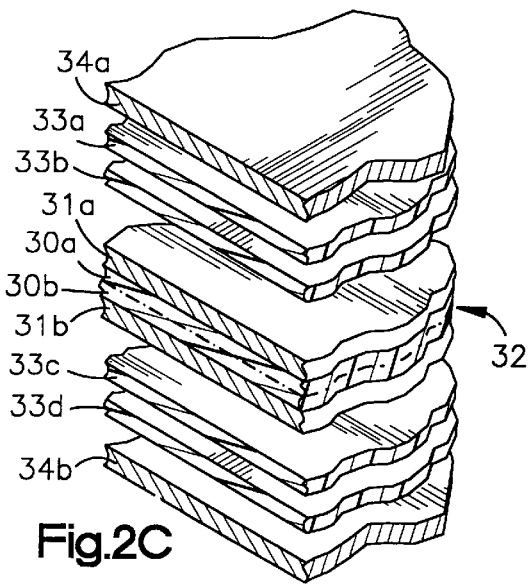
FIG. 2C is a schematic representation of a raw core and sticker sheets and copper sheets positioned to be laminated and form a chip carrier.
Figure 2D:
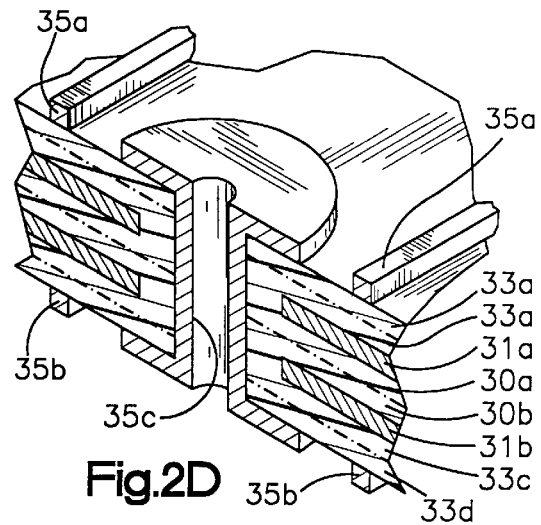
FIG. 2D is a schematic representation of a chip carrier.

In other embodiments, the core 32 is used to form buried planes such as ground planes and power planes, or even signal planes. As shown in FIG. 2C, two additional sheets of prepreg 33a and 33b are laminated to sheet 31a and to a sheet of copper 34a and two additional sheets of prepreg 33c and 33d are laminated to sheet 31b and sheet of copper 34b and essentially fully cured by heat and pressure. These sheets, ready for lamination, are shown in FIG. 2C. Copper sheets 34a and 34b are used to form circuit traces 35a and 35b by subtractive etching. Plated through holes 35c are formed in a conventional manner as shown in FIG. 2D. These raw cores and completed circuit boards or chip carriers are well known in the art as are the various techniques for forming them, and thus they are only briefly described.

As indicated above, in the formation of resin-impregnated fiberglass sheets, a condition such as pin holing or pin holes can exist. This condition is characterized by there being pin hole size openings through the resin which has been impregnated during the single pass through the coating solution and treater tower and is partially cured. These pin holes are typically located in the interstices of the glass weave. Also as indicated above, the frequency or density of pin holes varies with the thickness of the cloth. The cloth styles of intermediate thickness seem to be the most susceptible to pinholing, while very light weight and heavy weight cloths have a lower defect density. The present invention overcomes this problem and significantly reduces pin holing, even on problematic weaves, thus allowing the use of but a single sticker sheet between adjacent planes in many cases.

According to the present invention, the impregnation and partial curing of the resin on the fiberglass sheet is accomplished in two passes, i.e., two separate coating and partial curing operations are performed sequentially on the roll of fiberglass material. During the first pass, the solution concentration, temperature and viscosity of the solution of the resin, as well as the speed of travel through the treater 20 and temperatures in the treater tower 20, are selected such that as the fiberglass cloth passes through the solution, the solution coats less than the final amount of resin desired onto the sheet. The resin solution coats both the fibers and, to a significant extent, the windows or interstices between the fibers. However, there will be some pin holes formed, and indeed a significant number of pin holes may be formed just as in the prior art since less material is being applied.

Figure 3:
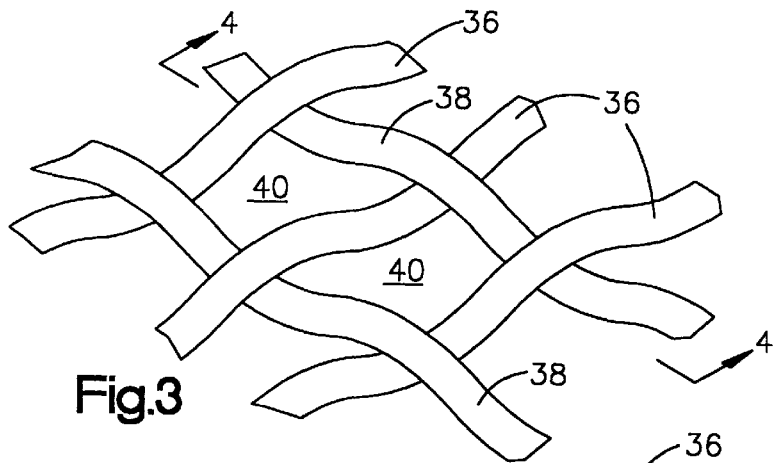
FIG. 3 is a view on an enlarged scale of the portion of woven fiberglass cloth before coating according to this invention.
Figure 4:
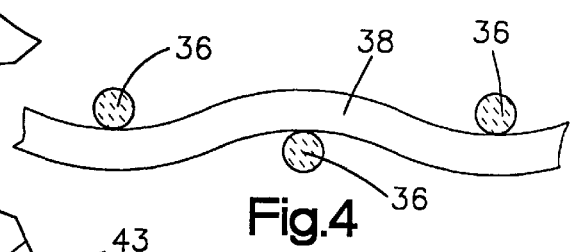
FIG. 4 is a sectional view taken substantially along the plane designated by the line 4—4 of FIG. 3.
Figure 5:
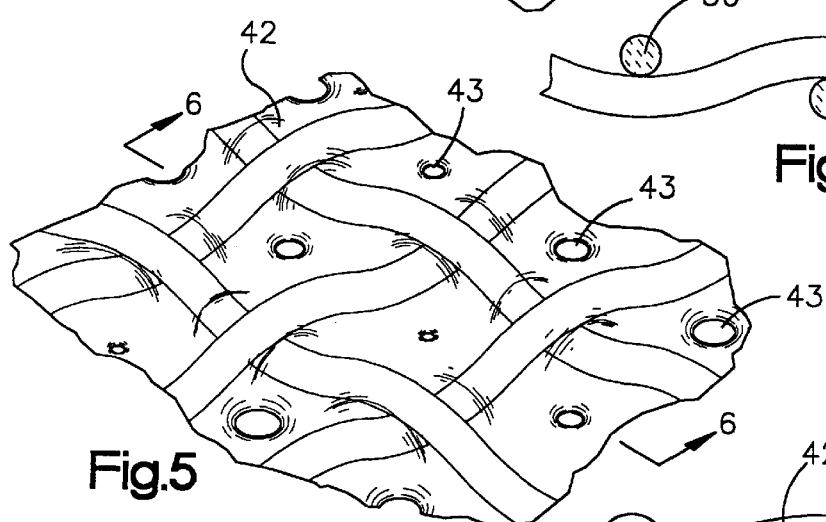
FIG. 5 is a view similar to FIG. 3 after the initial coating of the fiberglass cloth with a resin and partially cured according to this invention.
Figure 6:
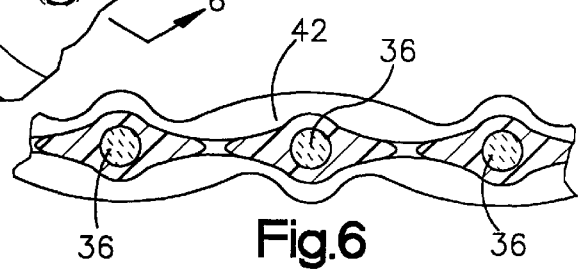
FIG. 6 is a sectional view taken substantially along the plane designed by line 6—6 of FIG. 5.

FIGS. 3 and 4 show a small section of woven fiberglass cloth ready for coating. The cloth has woof fibers 36 and warp fibers 38 which are woven in a conventional way to form interstices or windows 40. The fiberglass may have an adhesion promoting coating, such as a silane (not shown), thereon. After the first pass and partial cure, the resin material forms a coating 42 of partially-cured resin over the fibers 36 and 38, and also to a significant extent, filling the windows 40. After the first pass and partial cure, the resin material forms a coating 42 of partially-cured resin over the fibers 36 and 38 and in most of the windows 40. The coating is cured sufficiently that it will not redissolve on a subsequent pass through the solution; this may be a little more cured than conventional B stage cure. However, as can be seen in FIGS. 5 and 6, there is a certain number of holes or spaces 43 formed in the windows where the resin material did not completely cover during the initial coating or during curing formed pin holes.

In order to overcome this pin hole condition, the fiberglass, which has been resin-coated and partially cured in the first pass, is left in the coil form and is then given a second pass through a solution 14 of the same resin and solvent. The resin solution during the second pass coats over the first coating of resin, filling in those holes 43 left in the first coating 42 and provides the desired total amount of resin loading in the fiberglass, forming a second coating 44 over the first coating 42. As indicated earlier, the first coating 42 is sufficiently cured so it will not redissolve in the resin/solvent mixture of the second coating when the second coating is applied. It should be understood that the second coating procedure could be performed on a second coating line in a continuous manner following the emergence of the partially cured cloth from the treater tower 20 after the first coating, obviating the necessity of coiling and recoating in the same line. The coating parameters, such as coating speed, solution temperature, solution viscosity, are selected such that after cure, the desired total amount of resin will be impregnated on the cloth.

Figure 7:
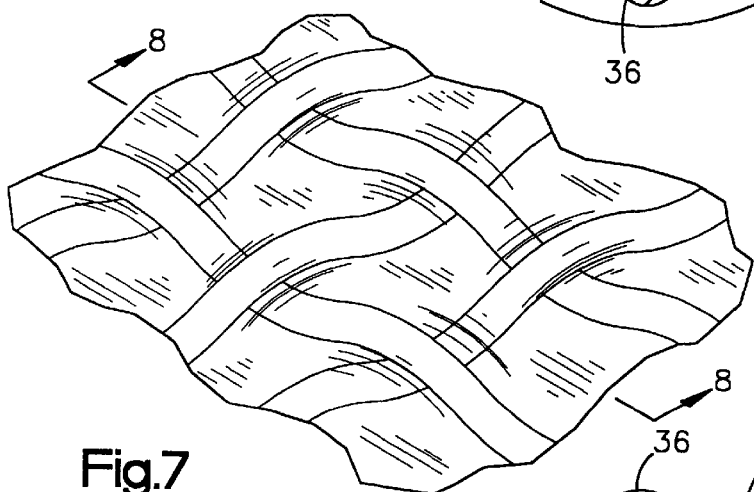
FIG. 7 is a view similar to FIGS. 3 and 5 after a second coating of resin has been placed over the first coating of the fiberglass cloth.
Figure 8:
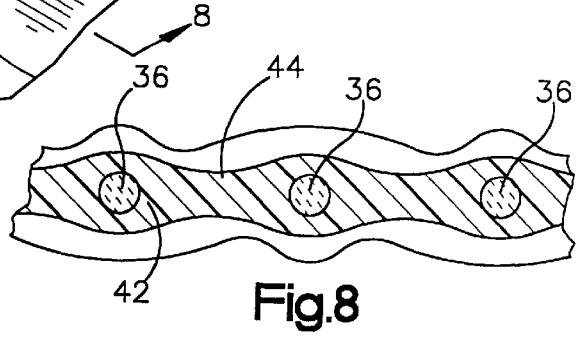
FIG. 8 is a sectional view taken substantially along the plane designated by the line 8—8 of FIG. 7.

Since the fiberglass cloth on the second pass is also passed through the treater tower 20, the outer coating is partially cured to a B-stage cure. While this second heating advances the cure of the inner coating 42 it does not fully cure it. The second coating 44 forms a bond with the first coating 42 during the partial cure. This condition is shown in FIGS. 7 and 8. It should be understood, however, that the sharp demarkation between the first and second layers shown in FIG. 8 is for the purpose of illustration and that the transition between these layers is smooth and such that the two layers are substantially continuous; i.e., the bonding and crosslinking of the polymer results in essentially a continuous film of polymer formed of two layers. However, the layers are distinct in that they can be individually identified by the stage or amount of cure of each.

After the second coating process wherein the outer coating 44 is applied and partially cured, the sheets are then cut and lamination takes place in a conventional manner. The further curing during the lamination finishes the bonding process of the outer coating 44 to the inner coating 42 forming a strong adherent rigid structure.

The specific resins used can vary, as long as the resin has the properties of being able to be coated from a solvent solution and partially cured, and in the first coating to adhere only to the fibers and at least partially fill in the windows. Particularly useful resins are epoxy resins, such as XU8213 sold by Ciba-Geigy Company, which are well known in the art, and also bismaleimide triazine (BT) which can be used alone, or which is preferably blended with epoxy. This blend when blended with epoxy typically is a $60/40$ or $50/50$ BT:epoxy ratio. The BT/epoxy blend has a particularly good adherence to glass thus forming a good interface and encapsulating the glass fibers during the first pass. If epoxy alone is used, epoxy has a particularly good interface to copper. Other useful resins include polyimides and cyanate esters and mixtures of cyanate esters and epoxies. In any event, the same resin that is used for the first pass is used for the second pass, with the loading, and/or viscosity, and/or temperature and/or speed of the fiberglass cloth and/or the temperatures in the treater tower 20 being adjusted in each pass to provide, during the first pass, the coating of the fibers and to some extent filling in most interstices or windows, and, during the second pass, the coating onto the first coating.

Fiberglass sheets formed according to this invention can utilize thick, coarse weave fiberglass with much less problem with pin holing. Thus, a single sheet in many instances provides the necessary dielectric thickness which in the past required two sheets because of the pin holing problem.

The following table is an example of a procedure and parameters and materials used to form a roll of epoxy fiberglass impregnated utilizing two passes according to this invention compared with a procedure and parameters and materials typically used in a single pass prior art technique.

TABLE

| GRADE 1080 FIBERGLASS CLOTH[1] | | | |
|---|---|---|---|
| | Single Pass | Two Passes | |
| | Prior Art | First Pass | Second Pass |
| Treated Weight[2] | 9.9 | 6.7 | 9.9 |
| Resin Content[3] | 60 | 40 | 60 |
| Flow[4] | 25–30 | N/A | 20–25 |
| % Fully Cured[5] | 25–45 | 60 | 50–60 |
| Line Speed[6] M/Min. | 9–13 | 4–5 | 9–13 |
| Resin SpG.[7] Gr/CC | 11 | 11 | 11 |
| Resin Solids[8] | 65% | 65% | 65% |
| Catalyst Level[9] (PHR) | 0.13 | .13–.17 | 0.13 |
| Meter Roll Gap.[10] (um) | 180–230 | 180–230 | 180–230 |
| Meter Roll Speed[11] (M/Min) | 2.5 | 2.5 | 2.5 |

TABLE-continued

GRADE 1080 FIBERGLASS CLOTH[1]

| | Single Pass | Two Passes | |
|---|---|---|---|
| | Prior Art | First Pass | Second Pass |
| Oven temps[12]: | | | |
| Zone #1 (° C.) | 110 | 110 | 110 |
| Zone #2 (° C.) | 115 | 140 | 115 |
| Zone #3 (° C.) | 160 | 155 | 160 |
| Zone #4 (° C.) | 175 | 175 | 175 |
| Zone #5 (° C.) | 175 | 175 | 175 |
| Zone #6 (° C.) | 160 | 175 | 160 |
| Air Velocity[13] (M/min.) | 6 | 6 | 6 |
| Residence Time[14] (min.) | 2.5 | 6.5 | 2.5 |

[1]1080 is a standard industry grade description of glass fiber cloth having a given fiber size and weave and has a weight of 1.45 gram/yd.$^2$
[2]The weight of 128 square inch piece of cloth after resin impregnation.
[3]The percent of resin in the treated cloth. The preferred resin is Ciba-Geigy's XU8213, which is contained in a solvent which is preferably methyl ethyl ketone.
[4]A flow is measured by cutting eight 4" × 4" pieces of cloth after curing, and pressing them together. The amount of resin pressed out is expressed as a percent of the total resin content.
[5]The percent fully cured of the resin as measured by flaking pieces of resin off of the cured cloth and determining the percent cure. In the case of the percent cured after the second pass, since there is a mixed cure of the first and second resin, this is an estimate.
[6]The speed of the cloth as it is driven through the resin solution and the treater tower.
[7]Resin specific gravity.
[8]Resin solids is the percent of resin in the solvent. The preferred solvent is given.
[9]The level of the catalyst, which in the preferred embodiment is 2-methylimidazol in parts per 100 parts of resin.
[10]The gap between the meter rolls.
[11]The meter roll speed in meters per minute.
[12]The oven temperature of the various zones in the treater tower.
[13]The velocity of the air flowing in the treater tower.
[14]The time the impregnated cloth is in the treater tower.

As can be seen from the table above, many of the parameters are the same for both the first pass and the second pass in the present invention. Also, many of the parameters are the same for the second pass of the present invention and the prior art single pass. The main differences are in the line speed and the temperatures of the oven zones on the first pass as compared to the prior art single pass technique. The line speed is significantly slowed down, and the oven temperatures changed in some of the zones. The slowing down of the line speed results in less resin being impregnated into the cloth than at a faster line speed. This is because during the slow line speed on the vertical run of the cloth as it is coming out of the resin solution, it has more time to drain and, thus, more of the resin which has been coated onto it drains off back into the solution 14 of the resin. The temperature changes in the oven, coupled with the slower speed results in a more complete cure of the first pass resin than is achieved with the prior art single pass technique; i.e., in the prior art single pass technique, the cure for B-stage is 20–45%, whereas after the first pass of the two pass technique according to the present invention, there is about a 60% complete cure. This additional cure is desired to insure that, during the second pass of the present invention, the resin deposited on the first pass and partially cured does not redissolve, but rather remains as a base on which the second pass resin is deposited. Thus, the slower speed and higher temperatures in certain zones of the oven result in a more fully cured resin, coating essentially the fibers and significant amount of the interstices which are then covered and fully filled in during the second pass wherein the parameters are preferably about the same as the parameters for a single pass technique. Other modifications such as change in viscosity, change in percentage of resin, etc., can be used to vary the coating weight.

It should be understood that the particular table of parameters is merely illustrative and that these can be varied significantly to obtain the desired results. For example, other cloth styles could be used. Typically, these cloths can include Grade 106, 2116 or 7628, as well as others which are suitable for resin impregnation. In addition, other cloths based on quartz, s-glass or organic fibers can be used. With these other types of cloth, the parameters or conditions of coating on the two passes are modified to obtain the desired results. Also, other resins can be used, as was explained above, which would cause the conditions to be changed, all of which is well-known in the art.

As indicated above, with thicker and/or coarse weave cloths, there is more of a tendency to pinholing. With the present invention, these thicker and/or coarse weave clothes can be used with less occurrence of pinholing, thereby making available a laminate using a single prepreg sheet wherein, in the past, two sheets would be required.

With prepreg formed according to this invention, one can build single sheet applications which, in turn, yield circuit boards and chip carriers of reduced thickness and weight. This is especially useful for laptops, palmtops, etc., and PCMCIA cards where thinness and light weight are paramount.

The invention has been described as used with woven glass fiber; however, non-woven fiberglass fabric can also be used even though the interstices are not as pronounced as in woven fabric.

The invention, while particularly useful for forming chip carriers where the test requirements are stringent, nevertheless, can be used in forming circuit boards if the testing requirements and use condition indicate this additional cost is justified.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A laminated substrate comprising, at least one sheet of material comprised of a resin impregnated layer of cloth having,
   a sheet of cloth having fibers and interstices between the fibers,
   a first coating of a selected thermosetting resin surrounding said fibers, and filling some, but not all, of said interstices, with essentially all of said interstices unfilled,
   a second coating of said selected thermosetting resin disposed over said first coating and with said second coating essentially filling all of said interstices unfilled by said first coating, said first coating being cured sufficiently beyond B stage cure so that it has not dissolved in the uncured resin of the second coating, said second coating being B stage cured; and a transition zone between said first and second coatings that is smooth, substantially continuous with crosslinking between said first and second coatings providing an essentially continuous polymer of two layers, laminated between two sheets of metal, and further characterized by said resins being essentially fully cured, to thereby substantially reduce pin hole defects.

2. The substrate as defined in claim 1 wherein at least one of said metal sheets is copper and forms circuit traces.

3. The substrate as defined in claim 2 wherein said substrate is an integrated circuit chip carrier.

4. The invention as defined in claim 1 wherein said substrate comprises a core, and wherein additional sheets of material as defined in 1 and additional sheets of metal are laminated on said core, and wherein said resin in said additional sheets is essentially fully cured.

* * * * *